US007822354B2

(12) United States Patent
Hayakawa

(10) Patent No.: US 7,822,354 B2
(45) Date of Patent: Oct. 26, 2010

(54) POWER CONSERVATION DEVICE AND IMAGE FORMING APPARATUS

(75) Inventor: Yoichi Hayakawa, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 11/723,005

(22) Filed: Mar. 15, 2007

(65) Prior Publication Data

US 2007/0230977 A1 Oct. 4, 2007

(30) Foreign Application Priority Data

Mar. 30, 2006 (JP) ............................ 2006-095637

(51) Int. Cl.
*G03G 15/00* (2006.01)
*H01L 27/00* (2006.01)

(52) U.S. Cl. ......................... 399/82; 250/208.1; 399/88

(58) Field of Classification Search ............ 250/559.11, 250/559.04, 208.1, 205, 235; 713/320, 323, 713/300; 358/1.16, 1.11–1.14; 399/88–90, 399/75–78, 9, 12, 16–23

See application file for complete search history.

(56) References Cited

U.S. PATENT DOCUMENTS 5,774,146 A * 6/1998 Mizutani ..................... 347/43
6,925,574 B2 * 8/2005 Satoh ......................... 713/323
2002/0126516 A1 * 9/2002 Jeon ............................ 363/67
2004/0146313 A1 * 7/2004 Uchizono et al. ............. 399/75
2006/0055972 A1 * 3/2006 Saikawa .................... 358/1.16

FOREIGN PATENT DOCUMENTS

JP 08-204890 8/1996

* cited by examiner

*Primary Examiner*—Que T Le
*Assistant Examiner*—Jennifer Bennett
(74) *Attorney, Agent, or Firm*—Kubotera & Associates LLC

(57) ABSTRACT

A power conservation device includes a detection unit for detecting a status of the power conservation device; a detection unit power source for supplying power to the detection unit; an operation control unit for controlling an operation of the power conservation device according to output information from the detection unit; an operation unit power source for supplying power to the operation control unit; an information processing unit for processing specific information and controlling the operation unit power source; and a monitoring unit for monitoring a change in the output information of the detection unit. The detection unit power source supplies power to the detection unit intermittently when the operation unit power source stops supplying power to the operation control unit. The information processing unit controls the operation unit power source to supply power to the operation unit when the monitoring unit detects the change in the output information of the detection unit.

6 Claims, 9 Drawing Sheets

POWER CONSERVATION DEVICE AND IMAGE FORMING APPARATUS

BACKGROUND OF THE INVENTION AND RELATED ART STATEMENT

The present invention relates to a power conservation device having a power save mode and an image forming apparatus.

Patent Reference has disclosed technology for conserving power of a photo sensor used for an apparatus such as an image forming apparatus. In a case of, for example, a photo interrupter for detecting a sheet, according to the technology disclosed in Patent Reference, a control unit is provided for switching power supply to a light emitting element of the photo interrupter. When the photo interrupter does not need to detect a sheet such as warming up the image forming apparatus or standby, the control unit turns off the power supply.

Patent Reference: Japanese Patent Publication No. 08-204890

In the conventional technology described above, the control unit simply switches on and off the power supply to the light emitting element of the photo interrupter. There is no unit for controlling power supply to the control unit for switching the power supply to the light emitting element of the photo interrupter. The control unit is generally formed of a CPU for controlling a printer engine. Accordingly, when the CPU starts up, a large amount of power is consumed.

In view of the problems described above, an object of the present invention is to provide a power conservation device and an image forming apparatus, in which it is possible to solve the problems of the conventional technology.

Further objects and advantages of the invention will be apparent from the following description of the invention.

SUMMARY OF THE INVENTION

In order to attain the objects described above, according to the present invention, a power conservation device operates in a power save mode for conserving power of an apparatus. The power conservation device includes a detection unit for detecting a status of the power conservation device; a detection unit power source for supplying power to the detection unit; an operation control unit for controlling an operation of the power conservation device according to output information from the detection unit; an operation unit power source for supplying power to the operation control unit; an information processing unit for processing specific information and controlling the operation unit power source; and a monitoring unit for monitoring a change in the output information of the detection unit.

Further, the detection unit power source supplies power to the detection unit intermittently when the operation unit power source stops supplying power to the operation control unit. The information processing unit controls the operation unit power source to supply power to the operation unit when the monitoring unit detects the change in the output information of the detection unit.

In the power conservation device of the present invention, in the power save mode, the detection unit power source supplies power to the detection unit intermittently. The monitoring unit monitors the change in the output information of the detection unit. When the monitoring unit detects the change in the output information of the detection unit, the operation unit power source supplies power to the operation unit. Accordingly, it is possible to accurately detect an operation conducted by an operator in the power save mode while power consumption is minimized.

DETAILED DESCRIPTION OF PREFERRED EMBODIMENTS

Hereunder, embodiments of the present invention will be explained with reference to the accompanying drawings.

First Embodiment

Figure 1:
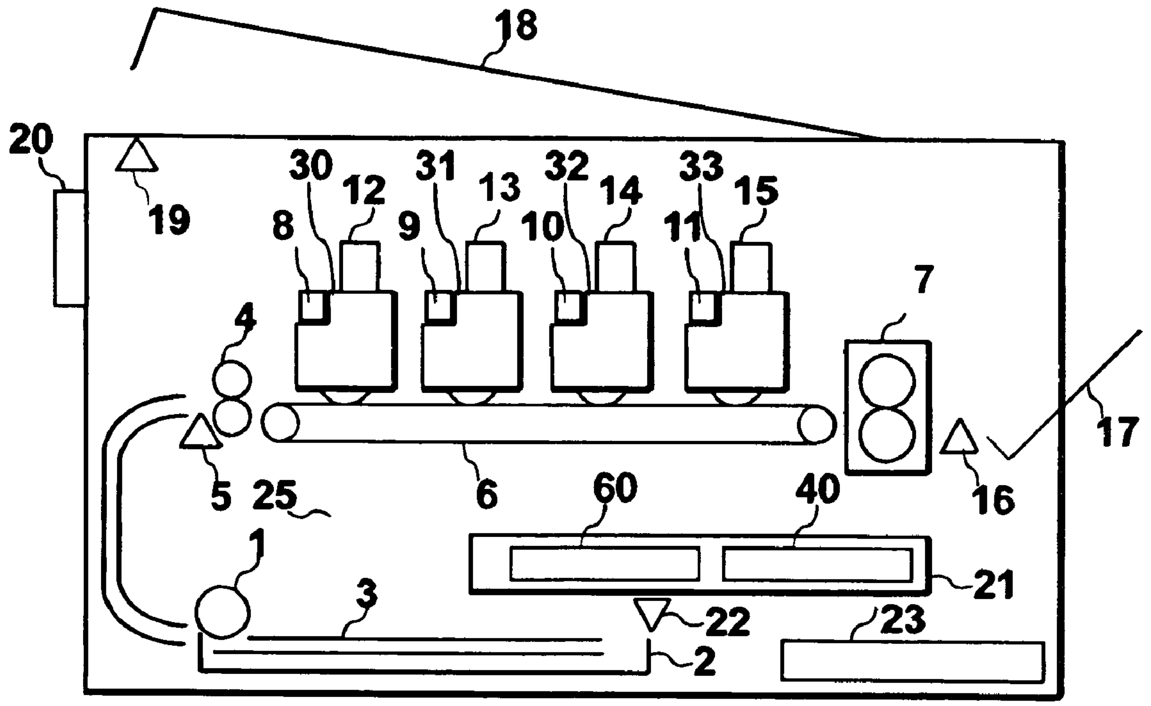
FIG. 1 is a schematic sectional view showing a configuration of an image forming apparatus according to the present invention.

A first embodiment of the present invention will be explained. FIG. 1 is a schematic sectional view showing a configuration of an image forming apparatus according to the present invention.

As shown in FIG. 1, in the image forming apparatus, a hopping roller 1 rotates to supply a sheet 3 placed in a sheet supply tray 2 to a sheet supply roller 4. The sheet supply roller 4 rotates to transport the sheet 3 to a belt 6, and the belt 6 further transports the sheet 3 to a fixing device 7. At this time, an image is formed on the sheet 3 with LED heads 30, 31, 32, and 33 and drum units 8, 9, 10, and 11. The fixing device 7 fixes the image to a surface of the sheet 3 by applying heat and pressure. Then, the sheet 3 is discharged to a stacker 17.

In the embodiment, a sheet supply sensor 5 and a discharge sensor 16 are provided for monitoring whether the sheet 3 passes through properly. When there is a problem such as a paper jam, the sheet supply sensor 6 and the discharge sensor 16 notify a control unit 21 of the problem. When the control unit 21 detects the problem, the control unit 21 immediately stops a printing operation. Further, the control unit 21 displays the problem on a operation panel 20 to prompt an operator to cancel the operation.

When the operator removes the paper jam, the operator opens a cover 18 to remove a sheet jammed inside the apparatus, and then closes the cover 18. A cover sensor 19 is provided for determining whether the cover 18 is opened or closed, and for notifying the control unit 21.

In the embodiment, the operator opens and closes the cover 18 also when toner cartridges 12, 13, 14, and 15 disposed in the drum units 8, 9, 10, and 11 are replaced due to lack of toner, or the drum units 8, 9, 10, and 11 or the fixing device 7 are replaced due to expiration of life. Further, the operator pulls out the sheet supply tray 2 to replenish media such as sheets, and inserts the sheet supply tray 2 after media are replenished. A sheet supply tray sensor 22 is provided for determining whether the sheet supply tray 2 is pulled out or inserted, and for notifying the control unit 21.

Figure 2:
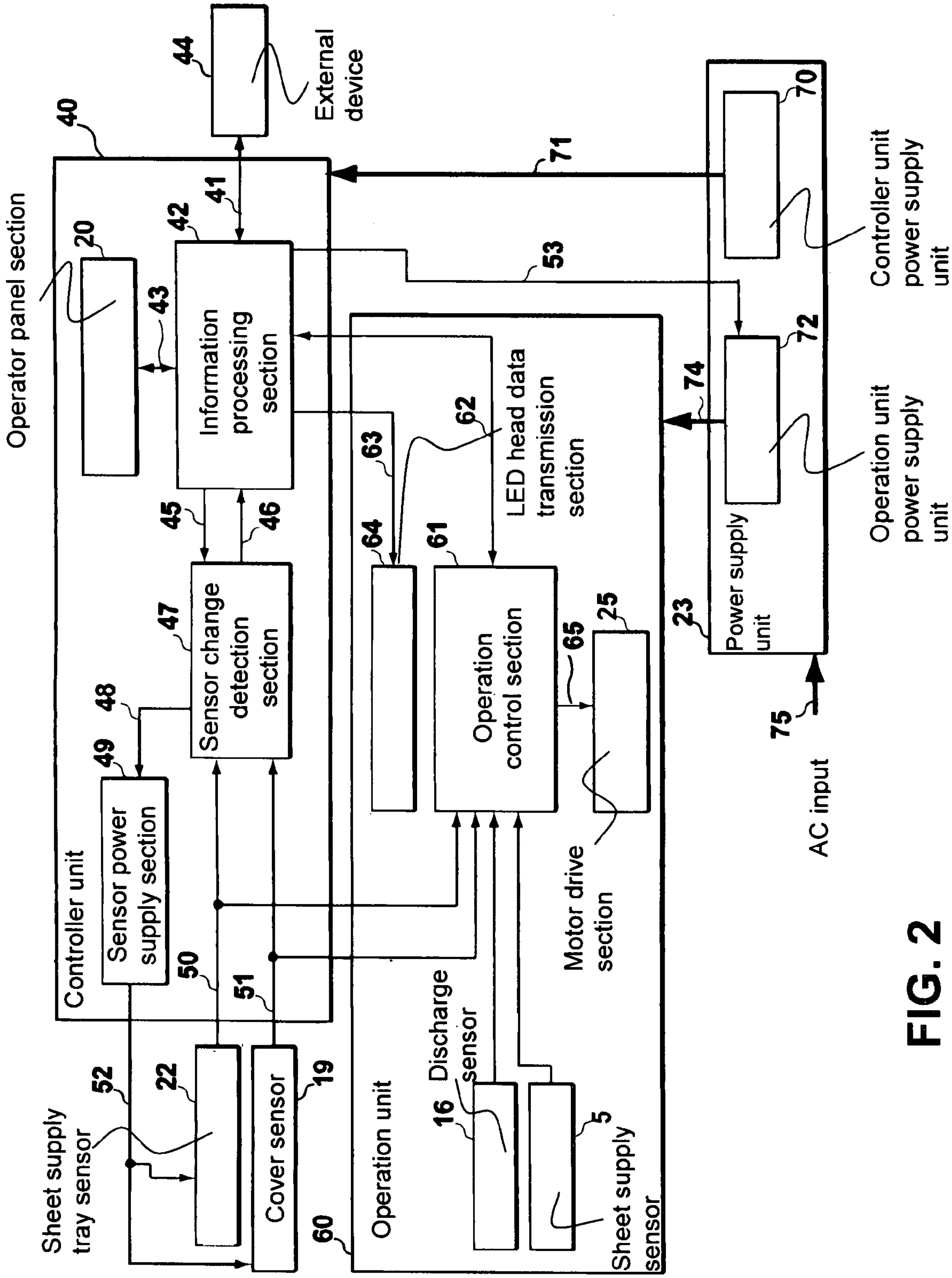
FIG. 2 is a block diagram showing a control system according to a first embodiment of the present invention.

In the embodiment, the control unit 21 includes an operation unit 60 and a controller unit 40. FIG. 2 is a block diagram showing a control system according to the first embodiment of the present invention. As shown in FIG. 2, a power supply unit 23 includes a controller unit power supply unit 70 for converting an AC input 75 to DC and supplying controller power 71 to the controller unit 40; and an operation unit power supply unit 72 for supplying operation unit power 74 to the operation unit 60 according to an operation unit power on/off signal 53.

In the embodiment, the controller unit 40 includes an operator panel section 20, an information processing section 42, a sensor change detection section 47, and a sensor power supply section 49, each powered by the controller power 71. The operator panel section 20 displays an operational status of a panel and outputs panel data 43 to the information processing section 42. The operator panel section 20 also receives the panel data 43 from the information processing section 42 for performing a panel displaying direction to display on the panel.

In the embodiment, the information processing section 42 has a logic operation function such as a CPU; a function of communicating with an external device 44 with communication data 41; a function of communicating with the operator panel section 20; a function of setting a sensor monitoring cycle and outputting a sensor monitoring cycle setting signal 45; a function of retrieving a sensor change notification signal 46; a function of communicating with an operation control section 61 with inter control unit communication 62; a function of drawing and deploying print data and transmitting deploy data 63 to an LED head data transmission section 63; a function of controlling transition of the apparatus to a power save mode; and a function of controlling standby from the power save mode or return to a print mode.

In the embodiment, the sensor change detection section 47 detects a change in a sensor input signal according to a cycle set by the sensor monitoring cycle setting signal 45, and outputs the sensor monitoring cycle setting signal 45 to the information processing section 42. Further, the sensor change detection section 47 outputs a sensor power supply ON/OFF signal 48 corresponding to the sensor monitoring cycle to the sensor power supply section 49. The sensor power supply section 49 receives the sensor power supply ON/OFF signal 48 from the sensor change detection section 47, and supplies power to the sheet supply tray sensor 22 and the cover sensor 19.

In the embodiment, the sheet supply tray sensor 22 and the cover sensor 19 output sensor outputs such as a sheet supply tray sensor output signal 50 and a cover sensor output signal 51 to the operation control section 61 and the sensor change detection section 47, respectively. The operation unit 60 includes the operation control section 61, an LED head data transmission section 64, a motor drive section 25, the discharge sensor 16, and the sheet supply sensor 5. The operation unit 60 performs a printing operation using the operation unit power 74 as a power source.

In the embodiment, the operation control section 61 has a logic operation function such as a CPU, and outputs a motor drive control signal 65 to control the motor drive section 25 upon receiving a print command from the information processing section 42. Further, the operation control section 61 monitors a medium transportation status (whether there is a paper jam) through the sensor inputs and an apparatus status other than the medium transportation status (whether the cover is opened or closed, or whether the sheet supply tray is pulled out). When it is determined that there is a problem, the operation control section 61 stops driving and notifies the information processing section 42 of monitor error information.

In the embodiment, the LED head data transmission section 64 has a function of sending the deploy data 63 per each LED head to the LED heads 30, 31, 32, and 33 according to the medium transportation status. Further, the discharge sensor 16 and the sheet supply sensor 5 send the sensor outputs thereof to the operation control section 61.

Figure 3:
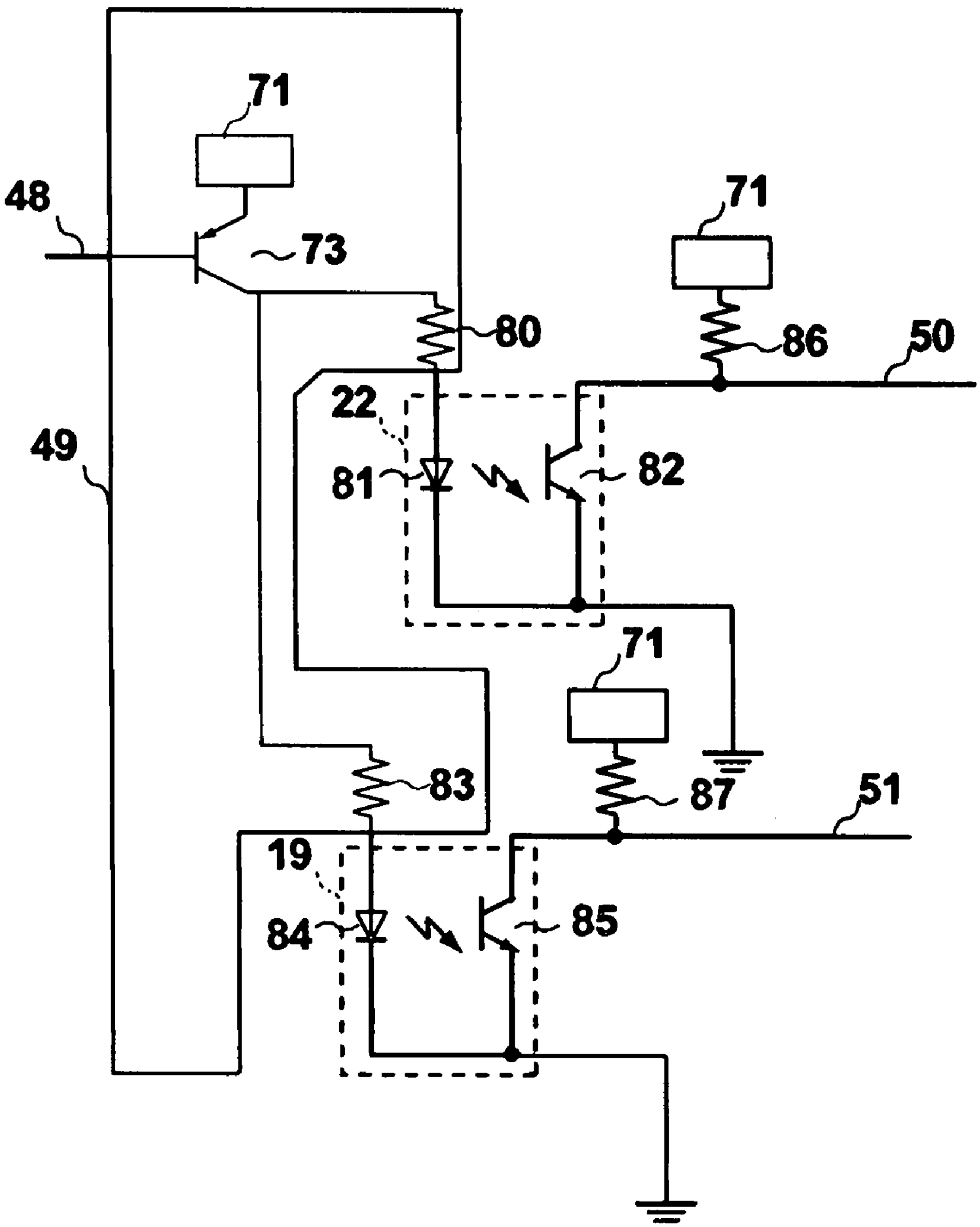
FIG. 3 is a circuit diagram of a photo sensor power supply circuit according to the first embodiment of the present invention.

FIG. 3 is a circuit diagram of a photo sensor power supply circuit according to the first embodiment of the present invention. With reference to FIG. 3, circuit configurations of the sensor power supply section 49, the sheet supply tray sensor 22, and the cover sensor 19 will be explained. The circuit includes the sheet supply tray sensor 22, the cover sensor 19, and a switching transistor 73 for switching power to the sheet supply tray sensor 22 and the cover sensor 19.

In the embodiment, the sheet supply tray sensor 22 is formed of a photodiode 81 and a phototransistor 82. The sheet supply tray sensor 22 is configured such that a light blocking member is inserted between the photodiode 81 and the phototransistor 82 when the sheet supply tray is inserted. An anode of the photodiode 81 is connected to a collector of the switching transistor 73 as the sensor power supply section 49 through a resistor 80, and a cathode of the photodiode 81 is connected to ground.

In the embodiment, the cover sensor 19 is formed of a photodiode 84 and a phototransistor 85. The cover sensor 19 is configured such that a light blocking member is inserted between the photodiode 84 and the phototransistor 85 when the cover is closed. An anode of the photodiode 84 is connected to a collector of the switching transistor 73 as the sensor power supply section 49 through a resistor 83, and a cathode of the photodiode 84 is connected to ground.

A collector of the phototransistor 82 is connected to the controller power 71 through a bias resistor 86, and an emitter of the phototransistor 82 is connected to ground. When the phototransistor 82 receives light emitted from the photodiode 81, the phototransistor 82 becomes an ON state and makes an output voltage of the collector at an L level. A collector voltage of the phototransistor 82 becomes the sheet supply tray sensor output signal 50 of the sheet supply tray sensor 22.

A collector of the phototransistor 85 is connected to the controller power 71 through a bias resistor 87, and an emitter of the phototransistor 85 is connected to ground. When the phototransistor 85 receives light emitted from the photodiode 84, the phototransistor 82 becomes an ON state and makes an output voltage of the collector at an L level.

A collector voltage of the phototransistor 85 becomes the sensor output signal 51 of the cover sensor 19. An emitter of the switching transistor 73 is connected to the controller power 71, and a base thereof is connected to the sensor power supply ON/OFF signal 48. Accordingly, the switching transistor 73 switches an ON/OFF state thereof according to the sensor power supply ON/OFF signal 48 applied to the base thereof.

When the switching transistor 73 becomes the ON state, the controller power 71 is connected to the photodiode 81 through the collector and emitter, so that a current flows in the photodiode 81 for emitting light. When the switching transistor 73 becomes the OFF state, a current does not flow in the photodiode 81, thereby emitting no light.

An operation of the information processing section 42 (FIG. 2) will be explained next. First, a transition operation from the printing or standby state to the power save mode will be explained. Then, the power save mode and a return operation from the power save mode to the printing or standby state will be explained.

Figure 4:
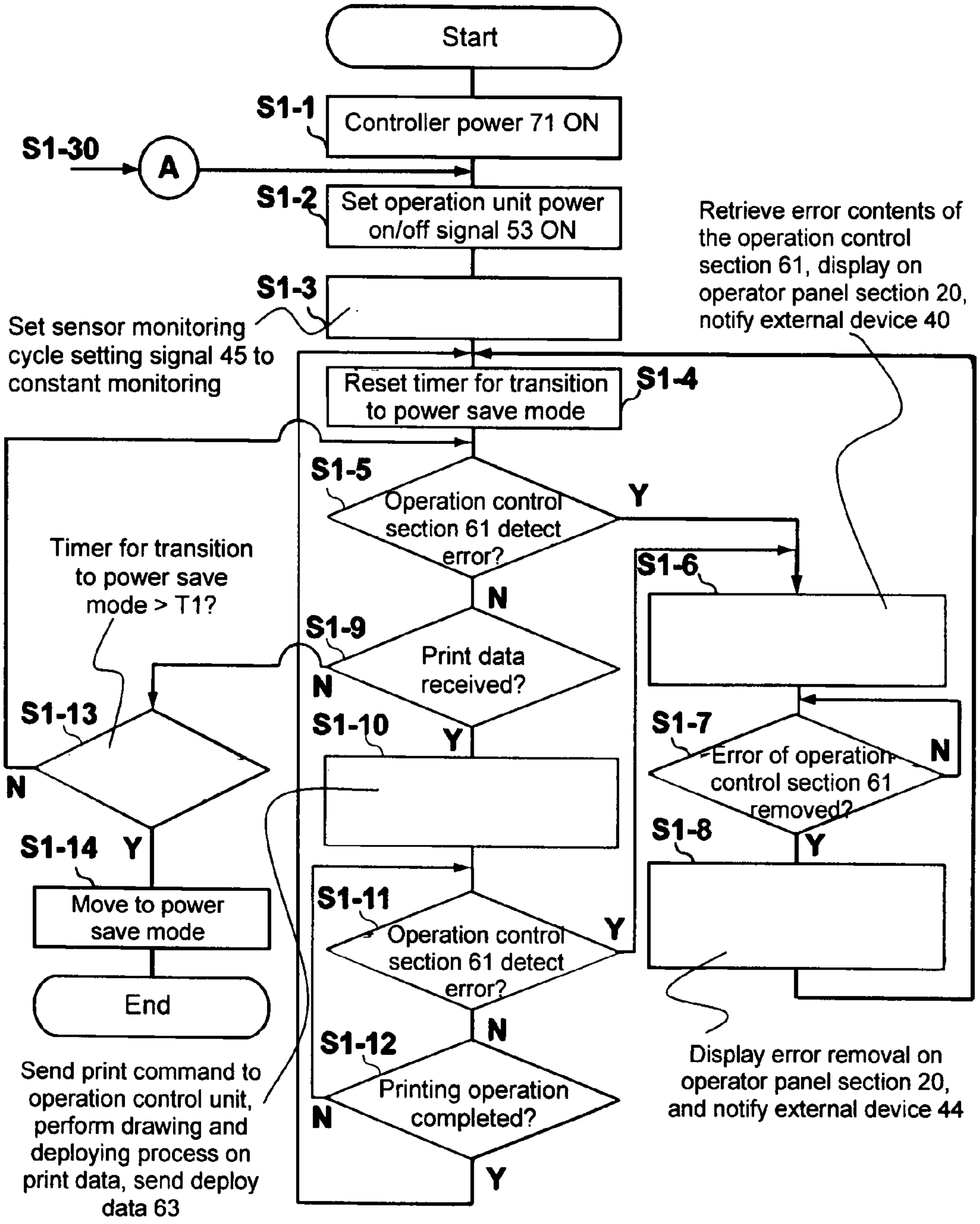
FIG. 4 is a flow chart showing an operation of printing and standby according to the first embodiment of the present invention.

FIG. 4 is a flow chart showing an operation of printing and standby according to the first embodiment of the present invention. In the explanation, it is assumed that the transition to the power save mode occurs after the standby state is maintained for a specific period of time (T1) in a printable state.

In step S1-1, when the power supply unit 23 is turned on (power on, AC input), the controller power 71 is supplied to the controller unit 40. In step S1-2, the information processing section 42 sets the operation unit power on/off signal 53 to be ON, and the operation unit power 74 is supplied to the sheet supply tray sensor output signal 50. Upon supplying power, the operation unit 60 starts operating.

In step S1-3, the information processing section 42 sets the sensor monitoring cycle setting signal 45 to constant monitoring. Operations of the sensor change detection section 47 and the photo sensors will be described later. In step S1-4, the information processing section 42 resets a timer (not shown) disposed therein, thereby starting timing (T1) for the transition to the power save mode.

In step S1-5, the information processing section 42 determines whether the operation control section 61 detects an error through each sensor. Note that the error indicates a non-printable state through reading the sensor output thus received. When the error is detected, the process proceeds to step S1-6. When the error is not detected, the process proceeds to step S1-9.

In step S1-6, the information processing section 42 retrieves error contents from the operation control section 61, and displays the error contents on the operator panel section 20. Further, the information processing section 42 notifies the external device 44 of the error contents. For example, when the error contents include the open state of the cover, the open state of the cover is notified.

In step S1-7, the information processing section 42 determines whether an error cause of the operation control section 61 is removed. The operation in step S1-7 is repeated until the error cause is removed. When the error cause is removed, the process proceeds to step S1-8.

In step S1-8, the information processing section 42 displays that the error cause is removed on the operator panel section 20, and notifies the external device 44 of the removal of the error cause. The process proceeds to step S1-9. In step S1-9, the information processing section 42 determines whether the print data is received from the external device 44. When the print data is received from the external device 44, the process proceeds to step S1-10. When the print data is not received from the external device 44, the process proceeds to step S1-13.

In step S1-10, the information processing section 42 performs the drawing and deploying process of the print data thus received, and sends the deploy data 63 to the LED head data transmission section 64. Further, the information processing section 42 sends the print command to the operation control section 61, so that the operation control section 61 performs the printing operation. The process proceeds to step S1-11.

In step S1-11, the information processing section 42 determines whether an error occurs during the printing operation of the operation control section 61. When the error occurs, the process proceeds to step S1-6. When the error does not occur, the process proceeds to step S1-12. In step S1-12, the information processing section 42 confirms whether the operation control section 61 completes the printing operation. When the operation control section 61 does not complete the printing operation, the process returns to step S1-11. When the operation control section 61 completes the printing operation, the process proceeds to step S1-14.

In step S1-13, the information processing section 42 determines whether the timer reset in step S1-4 passes the power save mode transition time T1. When the timer passes the power save mode transition time T1 (timer value>T1), the process proceeds to step S1-14. When the timer does not pass the power save mode transition time T1 (timer value<T1), the process returns to step S1-5. In step S1-14, the information processing section 42 moves to the power save mode, thereby completing the process.

Figure 5:
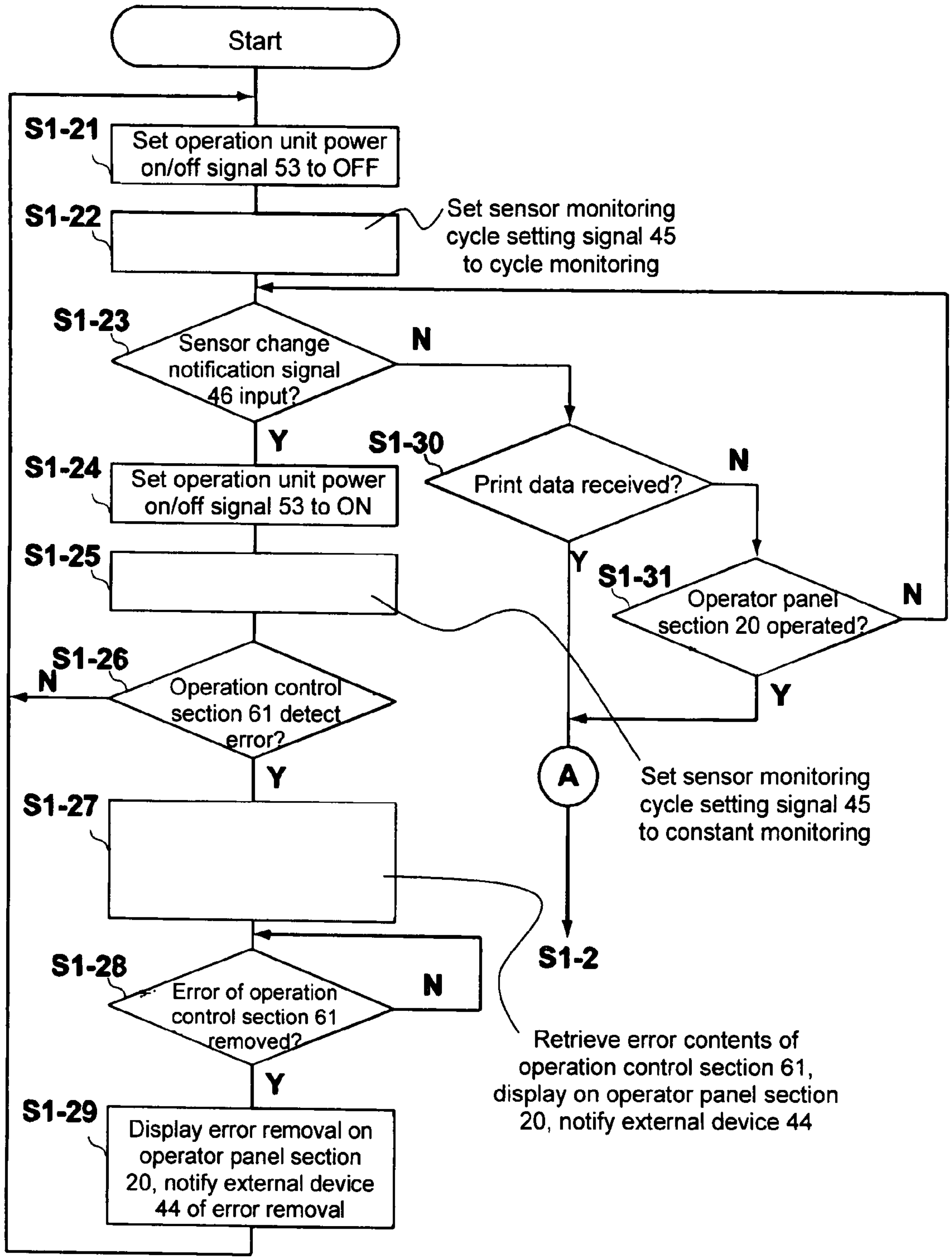
FIG. 5 is a flow chart showing an operation of a power save mode according to the first embodiment of the present invention.

The power save mode and the return operation from the power save mode to the printing or standby state will be explained next. FIG. 5 is a flow chart showing an operation of the power save mode according to the first embodiment of the present invention.

In step S1-21, the information processing section 42 sets the operation unit power on/off signal 53 to be OFF. Accordingly, the operation unit power 74 is not supplied to the operation unit 60, and the operation unit 60 does not perform any operation. In step S1-22, the information processing section 42 sets the sensor monitoring cycle setting signal 45 to cycle monitoring. Operations of the sensor change detection section 47 and the sensor detection section will be explained later.

In step S1-23, the information processing section 42 determines whether the sensor change notification signal 46 is input. When the sensor change notification signal 46 is input, the process proceeds to step S1-24. When the sensor change notification signal 46 is not input, the process proceeds to step S1-30.

In step S1-24, the information processing section 42 sets the operation unit power on/off signal 53 to be ON, so that the operation unit power 74 is supplied to the operation unit 60. In step S1-25, the information processing section 42 sets the sensor monitoring cycle setting signal 45 to the constant monitoring.

In step S1-26, the information processing section 42 determines whether the operation control section 61 detects an error. When the operation control section 61 detects the error, the process proceeds to step S1-27. When the operation control section 61 does not detect the error, the process returns to step S1-21. In detecting the error, when a signal representing a change in a state sent from each sensor is output continuously for a specific period of time, for example, more than 3 seconds, it is determined that the error is detected. Through this process, it is possible to eliminate a pseudo error, in which, for example, the operator opens and instantly closes the cover, or pulls out and instantly inserts the tray.

In step S1-27, the information processing section 42 retrieves error contents from the operation control section 61, and displays the error contents on the operator panel section 20. Further, the information processing section 42 notifies the external device 44 of the error contents. In step S1-28, the information processing section 42 determines whether an error cause of the operation control section 61 retrieved in step S1-27 is removed. When the error cause is not removed, the process waits in step S1-28 until the error cause is removed. When the error cause is removed, the process proceeds to step S1-29.

In step S1-29, the information processing section 42 displays that the error cause is removed on the operator panel section 20, and notifies the external device 44 of the removal of the error cause. The process returns to step S1-21. In step S1-30, the information processing section 42 determines whether the print data is received from the external device 44. When the print data is received from the external device 44, the process returns to step S1-2 (the return process from the power save mode). When the print data is not received from the external device 44, the process proceeds to step S1-31.

In step S1-31, the information processing section 42 determines whether the operator panel section 20 is operated. When the operator panel section 20 is operated, the process returns to step S1-2 (the return process from the power save mode). When the operator panel section 20 is not operated, the process returns to step S1-23.

Figure 6:
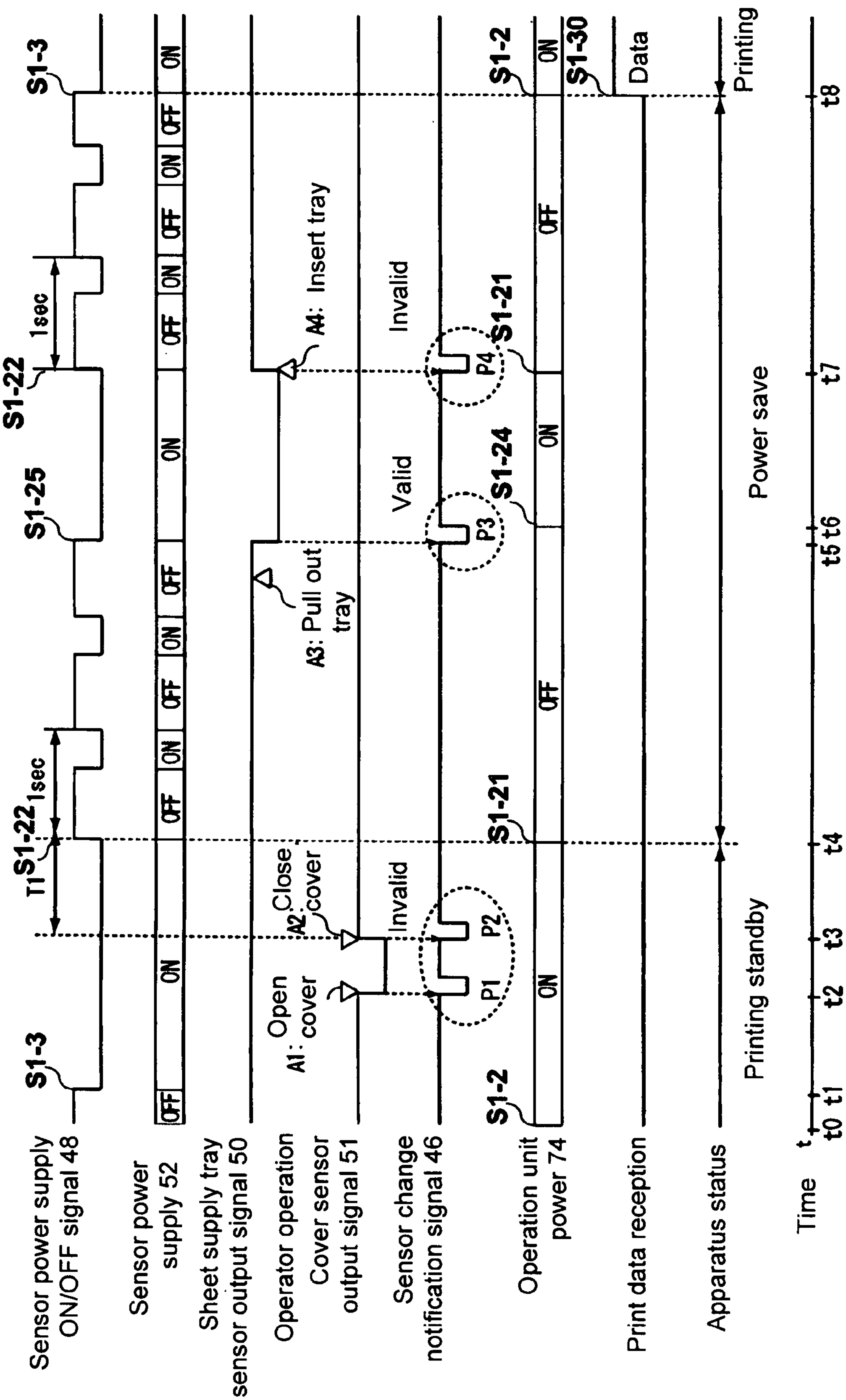
FIG. 6 is a time chart of power supply control according to the first embodiment of the present invention.

The operation described above will be further explained using a time chart. FIG. 6 is the time chart of power supply control according to the first embodiment of the present invention.

As shown in FIG. 6, each line represents, from the top, the signal level of the sensor power supply ON/OFF signal 48; the status of sensor power supply 52; the signal level of the sheet supply tray sensor output signal 50; the operation status of the operator; the signal level of the cover sensor output signal 51; the signal level of the sensor change notification signal 46; the status of the operation unit power 74, the reception status of the print data; the status of the apparatus; and a time axis common to each line at the bottom.

At time t0, the apparatus is in the printing or standby state, and the operation unit power on/off signal 53 is set to be ON. Further, the operation unit power 74 is supplied to the operation unit 60, so that the operation unit 60 performs the operation. At time t1, the information processing section 42 sets the sensor monitoring cycle setting signal 45 to the constant monitoring. Accordingly, the sensor power supply ON/OFF signal 48 is set to be ON (L level). Upon supplying the power to the sheet supply tray sensor 22 and the cover sensor 19, the sensor outputs become valid. Note that, in step S1-3, the cover is closed and the tray is inserted.

At time t2, when the operator opens the cover at A1, a pulse P1 is output to the sensor change notification signal 46. At this moment, as shown in FIG. 4, the information processing section 42 does not determine the input in the process of the printing state or the standby state (waiting for the printing operation). Accordingly, the pulse P1 is virtually ignored (the object of the invention is not achieved since the operation control section 61 is operating). Since power is supplied to the sheet supply tray sensor 22 and the cover sensor 19, it is possible to detect the sheet supply tray sensor output signal 50 and the cover sensor output signal 51 with the operation control section 61.

At time t3, when the operator closes the cover at A2, a pulse P2 is output to the sensor change notification signal 46. At this moment, as shown in FIG. 4, the information processing section 42 does not determine the input in the process of the printing state or the standby state (waiting for the printing operation). Accordingly, the pulse P2 is also virtually ignored.

At time t4, the process proceeds to the power save mode since the period of time T1 passes (step S1-21). When the sensor monitoring cycle is set to one second in step S1-22 shown in FIG. 5, the sensor power supply ON/OFF signal 48 becomes a pulse wave with one second cycle. Only when the sensor power supply ON/OFF signal 48 is at the L level, power is supplied to the sheet supply tray sensor 22 and the cover sensor 19, thereby validating the sensor outputs. At this moment, a width of the L level is longer than an output response time of the photo sensor (time from when power is supplied to the sensor to when the sensor output is stabilized), i.e., normally about 10 ms.

At time t5, when the operator pulls out the tray at A3, a pulse P3 is output to the sensor change notification signal 46. As shown in FIG. 5, the information processing section 42 determines the input of the sensor change notification signal 46 in the power save mode. Accordingly, the pulse P3 becomes a transition condition from step S1-23 to step S1-24.

At time t6, power is supplied to the operation unit 60 in step S1-24, and the sensor monitoring cycle is set to the constant monitoring in step S1-25. Accordingly, the operation control section 61 can detect the sheet supply tray sensor output signal 50 and the cover sensor output signal 51.

At time t7, when the operator inserts the tray at A4, a pulse P4 is output to the sensor change notification signal 46. At this moment, the information processing section 42 does not determine the input of the sensor change notification signal 46 from step S1-25 to step S1-29. Accordingly, the pulse P4 is virtually ignored. Since power is supplied to the sheet supply tray sensor 22 and the cover sensor 19, the operation control section 61 can detect the sheet supply tray sensor output signal 50 and the cover sensor output signal 51. Accordingly, the operation control section 61 detects the insertion of the tray, thereby becoming a transition condition from step S1-28 to step S1-29. At time t8, since the print data is received in step S1-30, the process proceeds from the power save mode to the printing mode.

As described above, in the embodiment, power to the operation unit 60 is turned OFF in the power save mode, and power is intermittently supplied to the sensors associated with the operation of the operator, i.e., the cover sensor 19 and the operator panel section 20. Then, the change status of the photo sensors is monitored. Only when there is the change, power is supplied to the operation unit 60. Further, it is possible to obtain the status of the apparatus through the photo sensors. Accordingly, it is possible to timely detect the operation of the operator in the power save mode, while the power consumption is minimized.

Second Embodiment

A second embodiment of the present invention will be explained next. In the first embodiment, power is supplied to the sheet supply tray sensor 22 and the cover sensor 19 intermittently at the same timing. In this case, a maximum level of a power current thus supplied tends to be too high. In the second embodiment, it is configured to reduce the maximum level of the power current.

Figure 7:
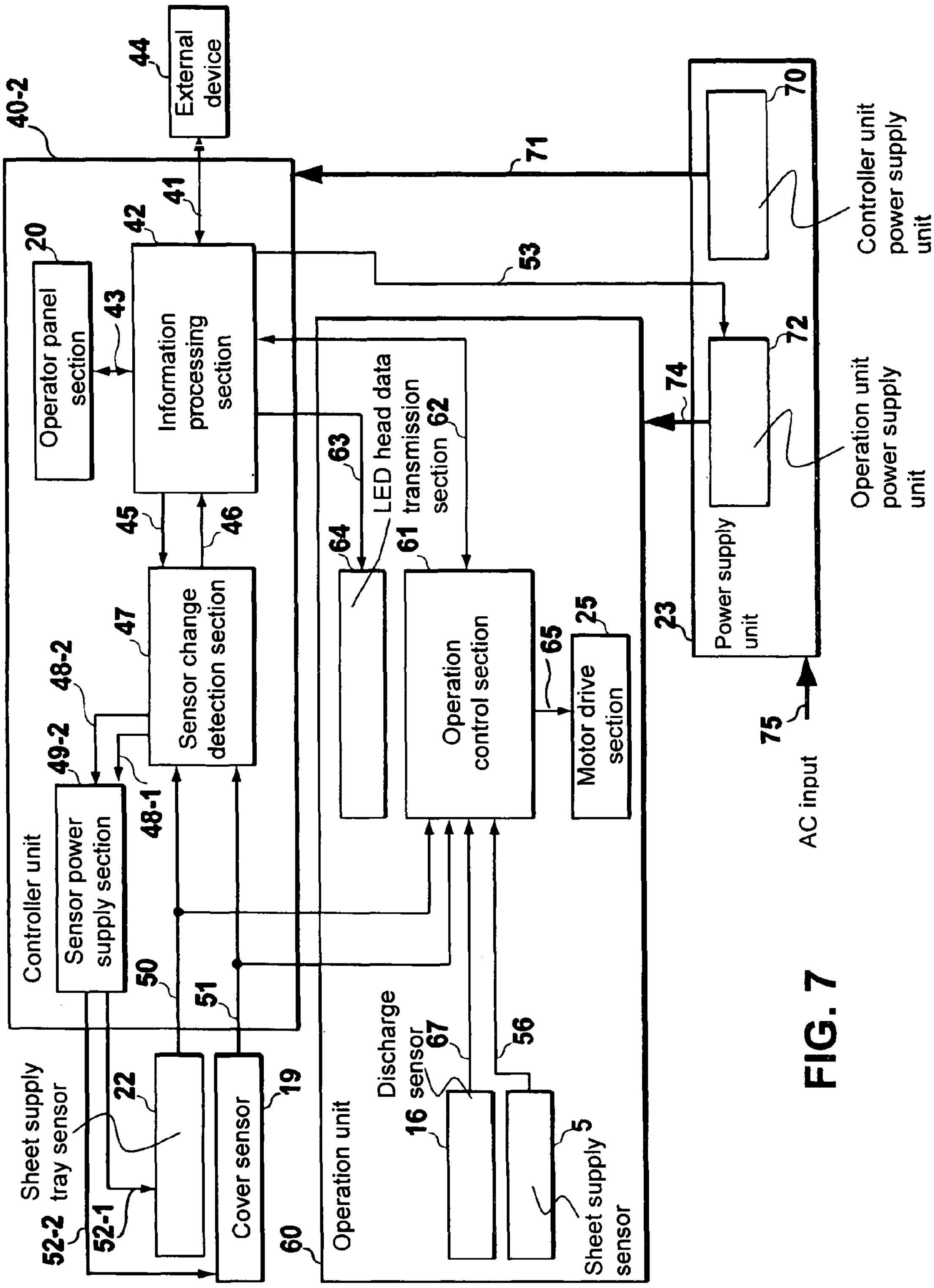
FIG. 7 is a block diagram showing a control system according to a second embodiment of the present invention.

FIG. 7 is a block diagram showing a control system according to the second embodiment of the present invention. As shown in FIG. 7, the power supply unit 23 includes the controller unit power supply unit 70 for converting the AC input 75 to DC and supplying the controller power 71 to a controller unit 40-2; and the operation unit power supply unit 72 for supplying the operation unit power 74 to the operation unit 60 according to the operation unit power on/off signal 53.

In the following description, only components different from those in the first embodiment will be explained. Other components similar to those in the first embodiment are designated by the same reference numerals, and explanations thereof are omitted.

In the embodiment, the controller unit 40-2 includes the operator panel section 20, the information processing section 42, the sensor change detection section 47, and a sensor power supply section 49-2, each powered by the controller power 71.

Figure 8:
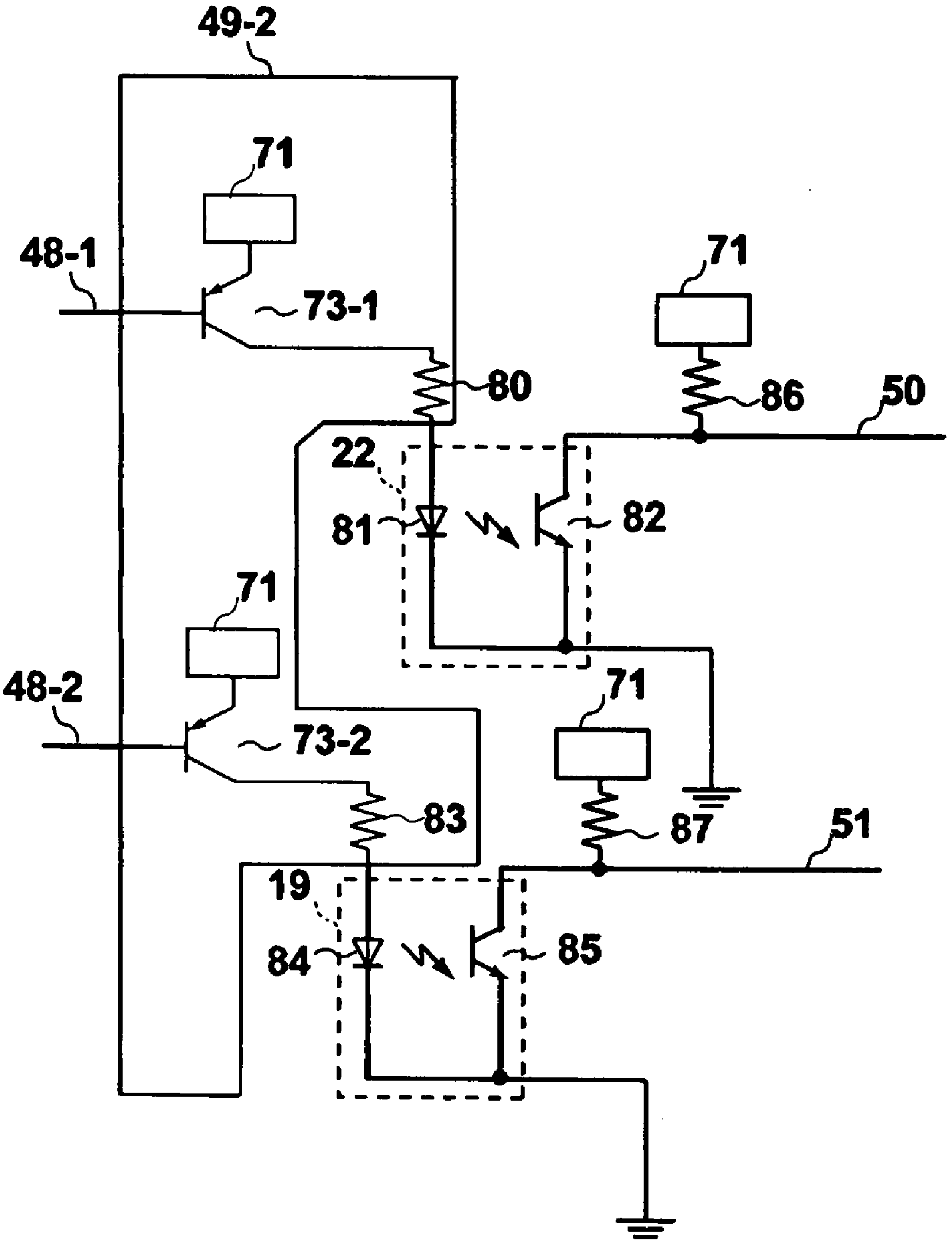
FIG. 8 is a circuit diagram of a photo sensor power supply circuit according to the second embodiment of the present invention.

FIG. 8 is a circuit diagram of a photo sensor power supply circuit according to the second embodiment of the present invention. With reference to FIG. 8, circuit configurations of the sensor power supply section 49-2, the sheet supply tray sensor 22, and the cover sensor 19 will be explained. The circuit includes the cover sensor 19, the sheet supply tray sensor 22, and switching transistors 73-1 and 73-2 as the sensor power supply section 49-2 for switching power to the sheet supply tray sensor 22 and the cover sensor 19.

In the embodiment, the sheet supply tray sensor 22 is formed of the photodiode 81 and the phototransistor 82. The sheet supply tray sensor 22 is configured such that a light blocking member is inserted between the photodiode 81 and the phototransistor 82 when the sheet supply tray is inserted. An anode of the photodiode 81 is connected to a collector of the switching transistor 73-1 through the resistor 80, and a cathode of the photodiode 81 is connected to ground.

A collector of the phototransistor 82 is connected to the controller power 71 through the bias resistor 86, and an emitter of the phototransistor 82 is connected to ground. A collector voltage of the phototransistor 82 becomes the sheet supply tray sensor output signal 50.

In the embodiment, the cover sensor 19 is formed of the photodiode 84 and the phototransistor 85. The cover sensor 19 is configured such that a light blocking member is inserted between the photodiode 84 and the phototransistor 85 when the cover is closed. An anode of the photodiode 84 is connected to a collector of the switching transistor 73-2 through the resistor 83, and a cathode of the photodiode 84 is connected to ground.

A collector of the phototransistor 85 is connected to the controller power 71 through the bias resistor 87, and an emitter of the phototransistor 85 is connected to ground. A collector voltage of the phototransistor 85 becomes the sensor output signal 51.

In the embodiment, when the phototransistor 82 of the sheet supply tray sensor 22 receives light emitted from the photodiode 81, the phototransistor 82 becomes an ON state and makes an output voltage of the collector at an L level. When the phototransistor 85 of the cover sensor 19 receives light emitted from the photodiode 84, the phototransistor 82 becomes an ON state and makes an output voltage of the collector at an L level.

An emitter of each of the switching transistor 73-1 and the switching transistor 73-2 is connected to the controller power 71. A base of the switching transistor 73-1 is connected to a sheet supply tray sensor power supply ON/OFF signal 48-1, while a base of the switching transistor 73-2 is connected to a tray sensor power supply ON/OFF signal 48-2.

Accordingly, the switching transistor 73-1 and the switching transistor 73-2 switch an ON/OFF state thereof according to the sheet supply tray sensor power supply ON/OFF signal 48-1 and the cover sensor power supply ON/OFF signal 48-2 applied to the bases thereof.

In the embodiment, a pulse shift unit (not shown) is provided for creating a timing difference of about 10 ms (a period of time that both signals are not ON at the same time) between the sheet supply tray sensor power supply ON/OFF signal 48-1 and the cover sensor power supply ON/OFF signal 48-2.

When the switching transistor 73-1 and the switching transistor 73-2 become the ON state, the controller power 71 is connected to the photodiodes 81 and 84 through the collectors and emitters, so that a current flows in the photodiodes 81 and 84 for emitting light. When the switching transistor 73-1 and the switching transistor 73-2 become the OFF state, a current does not flow in the photodiodes 81 and 84, thereby emitting no light.

An operation of the information processing section 42 (FIG. 1) will be explained next. In the second embodiment, the transition operation from the printing or standby state to the power save mode and the return operation from the power save mode to the printing or standby state are the same as those in the first embodiment, and explanations thereof are omitted. A difference in the second embodiment from the first embodiment is an operation timing in each operation, and the difference will be explained using a time chart.

Figure 9:
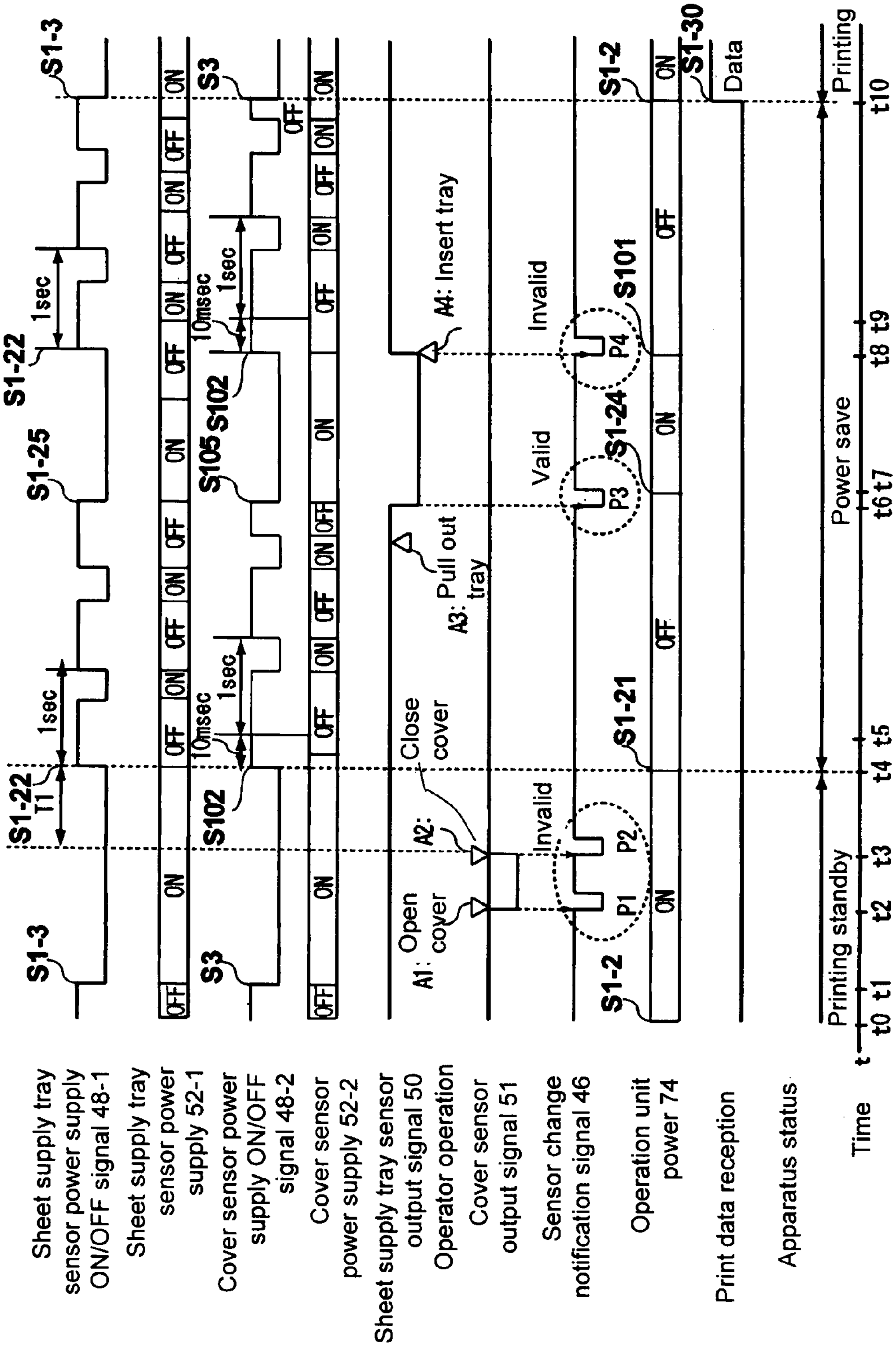
FIG. 9 is a time chart of power supply control according to the second embodiment of the present invention.

FIG. 9 is the time chart of power supply control according to the second embodiment of the present invention.

As shown in FIG. 9, each line represents, from the top, the signal level of the sheet supply tray sensor power supply ON/OFF signal 48-1; the status of sheet supply tray sensor power supply 52-1; the signal level of the cover sensor power supply ON/OFF signal 48-2; the status of cover sensor power supply 52-2; the signal level of the sheet supply tray sensor output signal 50; the operation status of the operator; the signal level of the cover sensor output signal 51; the signal level of the sensor change notification signal 46; the status of the operation unit power 74, the reception status of the print data; the status of the apparatus; and a time axis common to each line at the bottom.

At time t0, the apparatus is in the printing or standby state, and the operation unit power on/off signal 53 is set to be ON. Further, the operation unit power 74 is supplied to the operation unit 60, so that the operation unit 60 performs the operation. At time t1, the information processing section 42 sets the sensor monitoring cycle setting signal 45 to the constant monitoring. Accordingly, the sheet supply tray sensor power supply ON/OFF signal 48-1 and the cover sensor power supply ON/OFF signal 48-2 are set to be ON (L level). Upon supplying the power to the sheet supply tray sensor 22 and the cover sensor 19, the sensor outputs become valid. Note that, in step S1-3, the cover is closed and the tray is inserted.

At time t2, when the operator opens the cover at A1, the pulse P1 is output to the sensor change notification signal 46. At this moment, as shown in FIG. 4, the information processing section 42 does not determine the input in the process of the printing state or the standby state (waiting for the printing operation). Accordingly, the pulse P1 is virtually ignored. Since power is supplied to the sheet supply tray sensor 22 and the cover sensor 19, it is possible to detect the sheet supply tray sensor output signal 50 and the cover sensor output signal 51 with the operation control section 61.

At time t3, when the operator closes the cover at A2, the pulse P2 is output to the sensor change notification signal 46. At this moment, as shown in FIG. 4, the information processing section 42 does not determine the input in the process of the printing state or the standby state (waiting for the printing operation). Accordingly, the pulse P2 is also virtually ignored.

At time t4, the process proceeds to the power save mode since the period of time T1 passes (step S1-21). When the sensor monitoring cycle is set to one second in step S1-22 shown in FIG. 5, the sheet supply tray sensor power supply ON/OFF signal 48-1 becomes a pulse wave with one second cycle. Only when the sheet supply tray sensor power supply ON/OFF signal 48-1 is at the L level, power is supplied to the sheet supply tray sensor 22, thereby validating the sensor output. At this moment, a width of the L level is longer than an output response time of the photo sensor (time from when power is supplied to the sensor to when the sensor output is stabilized), i.e., normally about 10 ms.

At time t5, since the pulse shift unit (not shown) disposed in the sensor change detection section 47 creates the timing difference of, for example, about 10 ms, between the sheet supply tray sensor power supply ON/OFF signal 48-1 and the cover sensor power supply ON/OFF signal 48-2, the cover sensor power supply ON/OFF signal 48-2 becomes a pulse wave with one second cycle after 10 ms delayed from time t4. As described above, a width of the L level of each of the sheet supply tray sensor power supply ON/OFF signal 48-1 and the cover sensor power supply ON/OFF signal 48-2 is about 10 ms. Accordingly, with the timing difference of about 10 ms between the sheet supply tray sensor power supply ON/OFF signal 48-1 and 48-2, the power is not supplied to the cover sensor 19 and the sheet supply tray sensor 22 at the same time.

At time t6, when the operator pulls out the tray at A3, the pulse P3 is output to the sensor change notification signal 46. As shown in FIG. 5, the information processing section 42 determines the input of the sensor change notification signal 46 in the power save mode. Accordingly, the pulse P3 becomes the transition condition from step S1-23 to step S1-24.

At time t7, power is supplied to the operation unit 60 in step S1-24, and the sensor monitoring cycle is set to the constant monitoring in step S1-25. Accordingly, the operation control section 61 can detect the sheet supply tray sensor output signal 50 and the cover sensor output signal 51.

At time t8, when the operator inserts the tray at A4, the pulse P4 is output to the sensor change notification signal 46. At this moment, the information processing section 42 does not determine the input of the sensor change notification signal 46 from step S1-25 to step S1-29. Accordingly, the pulse P4 is virtually ignored. Since power is supplied to the sheet supply tray sensor 22 and the cover sensor 19, the operation control section 61 can detect the sheet supply tray sensor output signal 50 and the cover sensor output signal 51. Accordingly, the operation control section 61 detects the insertion of the tray, thereby becoming the transition condition from step S1-28 to step S1-29. Further, the sheet supply tray sensor power supply ON/OFF signal 48-1 becomes a pulse wave with one second cycle one more time.

At time t9, since the pulse shift unit (not shown) disposed in the sensor change detection section 47 creates the timing difference of, for example, about 10 ms, between the sheet supply tray sensor power supply ON/OFF signal 48-1 and 48-2, the cover sensor power supply ON/OFF signal 48-2 becomes a pulse wave with one second cycle after 10 ms delayed from time t8.

At time t10, since the print data is received in step S1-30, the process proceeds from the power save mode to the printing mode.

As described above, in the embodiment, the sensor power supply section 49-2 includes separately the switching transistor 73-1 for supplying the power to the sheet supply tray sensor 22 and the switching transistor 73-2 for supplying the power to the cover sensor 19, so that power is supplied to the sheet supply tray sensor 22 and the cover sensor 19 at the different timings. Accordingly, it is possible to avoid supplying to the sheet supply tray sensor 22 and the cover sensor 19 at the same time. Therefore, it is possible to reduce the peak current of the sensor power supply section 49-2. Further, it is possible to reduce cost of the components.

In the embodiments described above, the present invention is applied to the image forming apparatus, and is not limited thereto. For example, the operation unit and the controller unit may be applied to an image reading unit and an image processing unit, so that the present invention is applicable to a scanner or a multifunction device. Further, the operation unit and the controller unit may be applied to a disk rotation control unit and a data modulation unit, so that the present invention is applicable to a CD/MD player.

In the embodiments described above, the photo sensors are provided, and other type of sensors, for example, magnetic sensors, may be provided.

The disclosure of Japanese Patent Application No. 2006-095637, filed on Mar. 30, 2006, is incorporated in the application.

While the invention has been explained with reference to the specific embodiments of the invention, the explanation is illustrative and the invention is limited only by the appended claims.

What is claimed is:

1. An image forming apparatus capable of switching between a normal mode and a power save mode, comprising:
- a controller unit for communicating with an external device and processing print data to create deployed data;
- an operation unit for performing a mechanical operation of the image forming apparatus;
- a first detection unit for detecting a first status of the image forming apparatus;
- an operation control unit disposed in the operation unit for receiving the deployed data from the controller unit and controlling an operation of the operation unit, said operation control unit monitoring a change in an output of the first detection unit in the normal mode;
- an operation unit power source for supplying power to the operation unit in the normal mode;
- a monitoring unit disposed in the controller unit for directly monitoring a change in the output of the first detection unit in the power save mode without the output passing through the operation unit; and
- an information processing unit disposed in the controller unit for controlling the operation unit power source to stop supplying power to the operation unit in the power save mode.

2. The image forming apparatus according to claim 1, wherein said first detection unit is arranged to detect an operation of an operator.

3. The image forming apparatus according to claim 1, further comprising a second detection unit for detecting a second status of the image forming apparatus.

4. The image forming apparatus according to claim 1, wherein said controller unit is arranged to intermittently supply power to the first detection unit when the information processing unit controls the operation unit power source to stop supplyling power to the operation unit.

5. The image forming apparatus according to claim 1, wherein said first detection unit includes a light emitting element and a light reception element, said first detection unit detecting a member moving in and out of a light path between the light emitting element and the light reception element.

6. The image forming apparatus according to claim 1, wherein said information processing unit is arranged to control the operation unit power source to supply power to the operation control unit when the monitoring unit detects the change in the output of the first detection unit so that the operation control unit monitors the change in the output of the first detection unit.

* * * * *